United States Patent
Adams

(10) Patent No.: US 8,370,093 B1
(45) Date of Patent: Feb. 5, 2013

(54) METHOD AND SYSTEM FOR CALCULATING ENERGY METRICS OF A BUILDING AND ONE OR MORE ZONES WITHIN THE BUILDING

(75) Inventor: Andrew Adams, Tucker, GA (US)

(73) Assignee: Comverge, Inc., Norcross, GA (US)

( * ) Notice: Subject to any disclaimer, the term of this patent is extended or adjusted under 35 U.S.C. 154(b) by 0 days.

(21) Appl. No.: 13/411,619

(22) Filed: Mar. 4, 2012

Related U.S. Application Data

(63) Continuation of application No. 12/362,028, filed on Jan. 29, 2009, now Pat. No. 8,155,900.

(51) Int. Cl.
*G01R 21/00* (2006.01)
(52) U.S. Cl. .......................................... 702/62
(58) Field of Classification Search ............ 702/62, 702/130, 136, 182–185
See application file for complete search history.

(56) References Cited

U.S. PATENT DOCUMENTS

| | | | |
|---|---|---|---|
| 6,216,956 B1 | 4/2001 | Ehlers et al. | |
| 7,274,975 B2 | 9/2007 | Miller | |
| 7,392,661 B2 | 7/2008 | Alles | |
| 7,885,917 B2 | 2/2011 | Kuhns et al. | |
| 8,155,900 B1 * | 4/2012 | Adams | ............................ 702/62 |

* cited by examiner

*Primary Examiner* — Edward Raymond
(74) *Attorney, Agent, or Firm* — Smith Risley; Steven P. Wigmore

(57) ABSTRACT

A method and system can provide building energy performance metrics that can help identify specific zones within a building which may have energy efficiency problems. The method and system can collect data from: indoor temperature sensors and humidity sensors present in each zone of a building; one or more temperature sensors and humidity sensors present outside of the building; one or more utility meters; and one or more HVAC devices. This data from the sensors can be aggregated and formed into a first profile. The energy efficiency calculation system can analyze the first profile to provide various energy performance metrics which can include, but are not limited to, energy efficiency ratios for air conditioners, the R-value or thermal resistance of the building, an amount of heat loss for the building, energy consumption by the building, current HVAC performance parameters, and utility usage comparisons.

20 Claims, 11 Drawing Sheets

Zone C Analysis    Size: 1000 cu. ft. — 500, 502

How Many Windows in the Zone? _____ — 504
How Many Doors in the Zone? _____ — 506
Number of Months Since Last Check? _____ mos — 508
Number of Months Old Age for Windows? _____ mos — 510
Number of Windows Facing South? _____ — 512
Number of Windows Facing North? _____ — 514A
Identify Types of Windows:    glass/wood; aluminum/glass — 514B
Number of Ceiling Fans in Zone? _____ — 516
Height of Zone C in Feet? _____ — 518

*Fig. 5*

Zone C Recommendations — 600, 602

1) Replace the south-facing windows with tinted, aluminum/glass type – approximate heat loss savings: 100 Btu/hour 2) Provide one ceiling fan in Zone C – approximate energy consumption: 5¢ Kw/hr; approximate heat loss savings: 50 Btu/hr — 604

Would you like a window contractor to contact you? _____ — 606

*Fig. 6*

METHOD AND SYSTEM FOR CALCULATING ENERGY METRICS OF A BUILDING AND ONE OR MORE ZONES WITHIN THE BUILDING

PRIORITY AND RELATED APPLICATIONS STATEMENT

This application claims priority under 35 U.S.C. 120 and is a continuation of U.S. patent application Ser. No. 12/362,028, filed on Jan. 29, 2009 now U.S. Pat. No. 8,155,900 and entitled, "METHOD AND SYSTEM FOR CALCULATING ENERGY METRICS OF A BUILDING AND ONE OR MORE ZONES WITHIN THE BUILDING," the entire contents of which are hereby incorporated by reference.

TECHNICAL FIELD

The invention is generally directed to calculating energy metrics, and relates more particularly to calculating energy metrics for a building such as a single family home so that energy efficiency of the home may be improved.

BACKGROUND OF THE INVENTION

As buildings age, such as single family homes, their corresponding building materials which form the respective building deteriorate over time. For example, certain insulation as well as seals around windows of a building may deteriorate over time due to exposure to harsh conditions such a ultraviolet rays from the sun as well as harsh weather conditions like rain, wind, snow, and ice.

These harsh conditions can cause these building materials to deteriorate rapidly and to lose their effectiveness as insulators and barriers against moisture and air. When these building materials lose their effectiveness, they contribute to decreased energy efficiency of a building, such as the ability of a building to maintain a constant internal temperature when the outside temperature changes.

This means that the HVAC system of such a building will need to work harder to maintain the internal temperature of the building when the building has "energy leaks" caused by the deteriorated building materials. This increase work load for the HVAC system translates into higher energy costs for the consumer in addition to placing an unnecessary additional load on utility providers, such as on electricity, gas, and oil providers.

One problem associated with energy leaks of a building is that the occupant of a building may not be able to identify the source or location of the energy leaks within the building. In a typical building, such as in a single family home, several rooms of the building may be heated or cooled by a single HVAC device, such as by a furnace or central air conditioner. While a building occupant may notice a difference in overall energy costs when energy leaks occur within a building, the building occupant may not be able to accurately identify the source of these energy leaks, especially when each room of the building may have several different potential sources that constitute the energy leaks. For example, if each room of a building has several windows and one or more external doors, it would be very challenging for the building occupant to determine which window or door may be the sole cause or larger contributor of an energy leak.

Another problem with energy leaks that may be present in a building is how they can be repaired. Often, a building occupant may not have the requisite skill or time (or both) to repair the sources of the energy leaks. Therefore, the building occupant may need to identify a contractor with adequate skill to repair the sources or building materials associated with the energy leaks.

An additional problem is that building occupants frequently do not have a baseline with which to compare the energy efficiency of their building relative to other buildings. In other words, while it is an objective for a building to be as energy efficient as possible, it is well known that a building cannot be one-hundred percent energy efficient. However, it can be challenging for a building occupant to know what is the acceptable range of less than perfect energy efficiency performance.

Accordingly, there is a need in the art for a method and system which can provide useful baseline energy metrics from which a building occupant can compare their building against. There is also a need in the art for a method and system that can identify the location and specific source of energy leaks within a building. There is a further need in the art for a method and system which can help identify specific energy leaks, such as by a room or a zone. And lastly, there is a need in the art for a method and system which can help diagnose the sources of energy leaks in addition to suggesting contractors who may be able to repair the energy leaks.

SUMMARY OF THE INVENTION

A method and system can provide building energy performance metrics that can help identify specific zones within a building which may have energy efficiency problems. The method and system can collect data from: indoor temperature sensors and humidity sensors present in each zone of a building; one or more temperature sensors and humidity sensors present outside of the building; one or more utility meters; and one or more HVAC devices. This data from the sensors can be aggregated and formed into a first profile. This first profile can then be transmitted over a communications network to an energy efficiency calculation system. The energy efficiency calculation system can analyze the first profile to provide various energy performance metrics which can include, but are not limited to, energy efficiency ratios for air conditioners, the R-value or thermal resistance of the building, an amount of heat loss for the building, energy consumption by the building, current HVAC performance parameters, and utility usage comparisons.

In addition to calculating various energy performance metrics for a particular building, the energy efficiency calculation system can provide comparisons between a particular building and groups of buildings in a first geography and a second geography. For example, the energy efficiency calculation system can compare the energy performance metrics of a first building against energy performance metrics of a plurality of similar second buildings located in a zip code which is the same as the first building as well as against third buildings located in groups of zip codes adjacent to the first building. These comparisons with other buildings allow a user to determine what may be an acceptable level of efficiency given that most buildings will never have efficiencies at or near one-hundred percent.

The method and system can provide an interactive display which can provide the energy performance metrics depicted in an graphical manner in an easy to understand visual presentation. For example, a home energy efficiency rating system could include a graphical scale using different colors to define the energy efficiency value for a particular building. The method and system can display values of other buildings adjacent to the building of interest in a graphical manner, such as in line graphs and bar charts.

The method and system can also provide energy performance metrics for an overall building in addition to metrics that are specific to zones within the building. After calculating energy performance metrics for each zone, the method and system can also flag those zones which have individual metrics which are below acceptable minimums for performance. For these zones which are below acceptable minimums, the system and method can request additional information about those zones in order to perform additional calculations. This additional information requested for each zone of interest can include, but is not limited to, a number of windows in a zone, number of doors in a zone, types of windows in zone, number of ceiling fans in zone, the size of the zone in square feet, and the height of the zone.

After receiving the additional information about a zone which usually includes specifics on the physical features of the zone as described above, the energy efficiency calculation system can determine more specific energy efficiency metrics for the zone and then provide recommendations on potential solutions for improving the energy efficiency metrics for the zone of interest. The method and system may also list preferred vendors associated with the solutions that the method and system can contact if requested by the building occupant.

BRIEF DESCRIPTION OF THE DRAWINGS

FIG. 5 illustrates a user interface for a thermostat or personal computer which is displaying energy metrics for a particular zone within a building according to one exemplary embodiment of the invention.

FIG. 6 illustrates a user interface for a thermostat or personal computer which is displaying recommendations to improve energy performance for a particular zone within a building according to one exemplary embodiment of the invention.

DETAILED DESCRIPTION OF EXEMPLARY EMBODIMENTS

A method and system can provide building energy performance metrics that can help identify specific zones within a building which may have energy efficiency problems. The method and system can collect data from: indoor temperature sensors and humidity sensors present in each zone of a building; one or more temperature sensors and humidity sensors present outside of the building; one or more utility meters; and one or more HVAC devices. This data from the sensors can be aggregated and formed into a first profile. The energy efficiency calculation system can analyze the first profile to provide various energy performance metrics which can include, but are not limited to, energy efficiency ratios for air conditioners, the R-value or thermal resistance of the building, an amount of heat loss for the building, energy consumption by the building, current HVAC performance parameters, and utility usage comparisons.

Figures 1A, 1B:
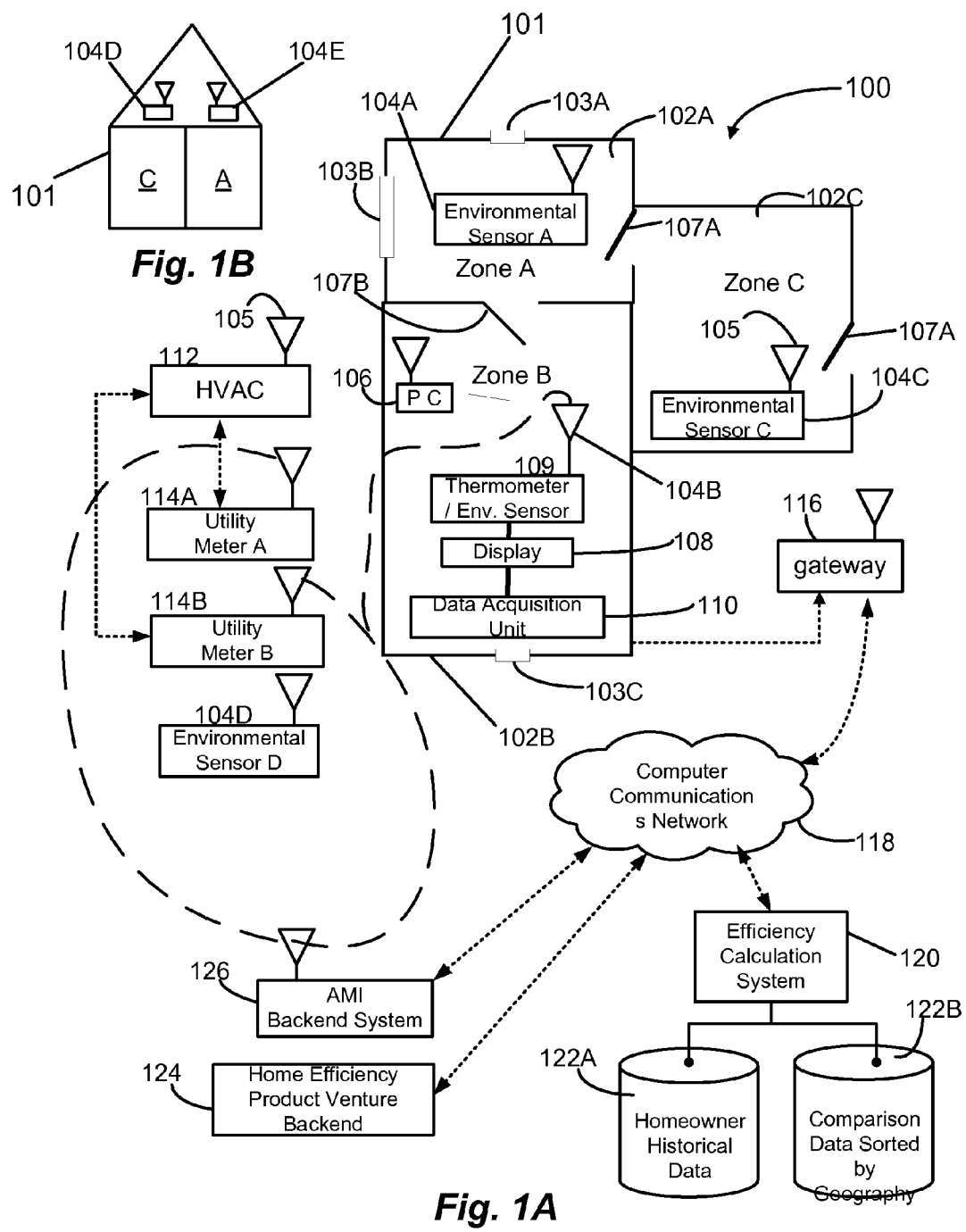
FIG. 1A is a functional block diagram illustrating a system for calculating energy efficiency metrics of a building and one or more zones within a building according to one exemplary embodiment of the invention.
FIG. 1B is a functional block diagram illustrating one or more zones within a building that can be taken into account for the energy efficiency metrics calculated by the system of FIG. 1A according to one exemplary embodiment of the invention.

Turning now to the drawings in which like reference numerals refer to like elements, FIG. 1A is a functional block diagram illustrating a system 100 for calculating energy efficiency metrics of a FIG. 101 and one or more zones A-C within the FIG. 101 according to one exemplary embodiment of the invention. FIG. 101 may have several different defined areas such as zones A-C. These zones A-C may each comprise an enclosed or defined area that are separate from one another such that each zone could be air tight relative to an adjacent zone. For example, zone A may have interior walls that have doors 107A and 107B which allow zone A to be completely enclosed or separated from its neighboring zones C and zone B. However, one of ordinary skill in the art recognizes that zones that are adjacent to each other within a building 101 but which do not have precise or physical barriers that separate one zone from another are not beyond the scope of the invention.

Each zone 102A, 102B and 102C illustrated in FIG. 1A has a rectilinear shape. The invention is not limited to rectilinear shaped zones and other shaped zones are within the scope of the invention. For example, each zone 102 could have a square or polygonal shape greater than four sides without departing from the scope of the invention.

In the exemplary embodiment illustrated in FIG. 1A, a first door 107A exists between a first zone 102A and a third zone 102C. A second door 107B separates the first zone 102A from the second zone 102B and a third door 107C in the third zone 102C comprises an exterior door which separates the third zone 102C from the outside. A fewer or a greater number of doors 107 can be provided without departing from the scope of the invention. For example, the first zone 102A could also comprise an exterior door 107 without departing from the scope of the invention. However, the exemplary embodiment illustrated in FIG. 1A only has interior doors 107A, 107B and no exterior doors for the first zone 102A.

The building 101 can be constructed from any type of building materials. For example, the figure materials can comprise of naturally occurring materials such as clay, sand, and wood, as well as many man-made products such as brick, concrete, metal, glass, ceramics, and plastics.

In addition to the doors 107, each zone 102 may also comprise one or more windows 103 present within the walls which form a respective zone 102. Typically, each window of a particular zone 102 will be provided on an exterior wall of the building 101. According to the system 101, each zone 102 will comprise at least one environmental sensor 104. Each environmental sensor 104 may comprise a temperature sensor and a relative humidity sensor. The temperature sensor can comprise a thermal couple. However, other types of temperature sensors are not beyond the scope of the invention. For example, the temperature sensor could easily comprise a thermistor, a resistance thermometer and a silicon band gap temperature sensor.

The relative humidity sensor can comprise a hygrometer. The hygrometer can be an electronic sensor which is either capacitive or resistive in nature. A capacitive hygrometer can sense water by applying an alternating current signal between two plates and measuring the change in capacitance caused by the amount of water present. Resistance hygrometers can use a polymer membrane which changes conductivity according to absorbed water in the environment.

Each environmental sensor 104 can be a wired or wireless device. In the exemplary embodiment illustrated in FIG. 1A, each environment in sensor 104 is a wireless device which may comprise an antenna 105 to establish a radio frequency blink between respective environmental sensors 104 and data acquisition unit 110. One of ordinary skill in the art recognizes that the other forms of wireless communications, besides radio frequency communications, are within the scope of the invention. For example, other wireless communication forms (not illustrated) include, but not limited to magnetic, optical, acoustic, and other like wireless media. As noted above, zone 102 of FIG. 1A may comprise a respective environmental sensor 104. Further, an outside environmental sensor 104D is also part of the system 100.

In addition to the environmental sensors 104, the system 100 further comprises one or more heating ventilation and air-conditioning (HVAC) units 112. Each HVAC unit 112 can comprise a heating unit or air-conditioning unit or combination thereof such as a heat pump. For heating applications, each HVAC unit could comprise a boiler, furnace, or heat pump. While not illustrated, the HVAC units 112 may feed into duct work, for forced air systems, or piping to distribute heated fluid to radiators which transfer heat to the air. The duct work may feed vents that are present in each one of the zones 102 or the pipes distributing a heated fluid may be coupled to a radiator in which a radiator not illustrated may be present in each zone 102. Radiators may be mounted to walls or buried in the floor.

For cooling applications, each HVAC unit 112 can comprise a central air-conditioning system that is coupled to duct work or a stand-alone air-conditioner such as a window mounted air conditioner known to one of ordinary skill in the art. While only one HVAC unit 112 is illustrated in FIG. 1A, one of ordinary skill in the art recognizes that two or more HVAC units 112 would physically be present in those systems which use a furnace or a boiler for heating application and a central air-conditioning system for cooling applications. Typically, the HVAC unit 112 comprising an air-conditioning system, and more specifically, a compressor fan, would be located on the exterior of the building 101. Meanwhile, an HVAC unit 112 for heating applications that may comprise a furnace or boiler would likely be present in a mechanical room in the interior of the building 101 and usually in a low-lying or subterranean level such as a basement inside of building 101. Each HVAC unit 112 also has communications abilities and may comprise an antenna 105 to support wireless communications.

The HVAC unit 112 may be linked with a communications network such as an advance metering infrastructure ("AMI") that is a system used to measure, collect, and analyze energy usage from enhanced devices such as utility meters 114 which include electricity meters, gas meters, and water meters through various communication media on request or on a predefined schedule. This AMI system typically includes hardware, software, communications, and customer associated systems and meter data management software. AMI typically permits two-way communications between the AMI back end system 126 and respective utility meters 114, as well as HVAC unit 112. The AMI back end system 126 can comprise the hardware, software, communications and customer associated systems and meter data management software mentioned above.

The system 100 in addition to the environmental sensors 104, HVAC units 112 and utility meters 114, can further comprise an enhanced thermostat 109 that is shown in the second zone 102B illustrated in FIG. 1A. The enhanced thermostat 109 can comprise its own environmental sensor not shown, in addition to a data acquisition unit 110. The data acquisition unit 110, generally, collects and formats the data received from the respective environmental sensors 104. Further details of the enhanced thermostat 109 will be described in further detail below in FIG. 7. One of ordinary skill in the art recognizes that more than one thermostat 109 can be employed in the system 100 without departing from the scope of the invention. For example, the first zone 102A and the third zone 102C each could have its respective thermostat 109 without departing from the scope of the invention.

Enhanced thermostat 109 in combination with its data acquisition unit 110 can be coupled to a communications gateway 116. The communications gateway 116, like the enhanced thermostat 108, can also comprise its own antenna 105 for supporting a wireless coupling between gateway 116 and the enhanced thermostat 108. However, wired couplings between gateway 116 and the enhanced thermostat 108 are not beyond the scope of the invention.

The gateway 116 can work on all seven OSI layers. The gateway 116 can receive information or data from the data acquisition unit 110 over a first wireless communication protocol that may be common to the environmental sensors 104 and the enhanced thermostat 108. The gateway 116 then converts this first communications protocol to the second communications protocol such as TCP/IP protocol.

The first wireless communications protocol that may be common among the environmental sensors 104 and the enhanced thermostat 108 can comprise the Zigbee communications protocol. This means that each wireless device illustrated in FIG. 1A may comprise a packet radio. For the Zigbee wireless communication protocol, each device such as the environmental sensors 104 may comprise a low-powered digital radio which employs the IEEE802.15.4-2006 standard for wireless personal area networks (WPANs). However, other communication protocols and standards for radio frequency communications are not beyond the scope of the invention. For example, other communication protocols can include, but are not limited to IEEE802.11, Bluetooth IEEE802.16 (wireless LAN), WAN, and other like wireless communication protocols.

The system 100 may further comprise a personal computer 106 that also supports wireless communication links with the gateway 116. However, wired links between the personal computer 106 and gateway 116 are not beyond the scope of the invention. Further details of the personal computer 106 will be described below in FIG. 8. The gateway 116 may be implemented in hardware, software or both and can be implemented by software installed within a conventional router. The gateway 116 can have a wired or wireless link with a computer communications network 118. The computer communications network 118 can comprise a wide area network (WAN), a local area network (LAN) or the Internet.

The computer communications network 118 can be coupled to the AMI back end system 126, a home efficiency product vendor backend 124, and an efficiency calculation system 120. The efficiency calculation system 120 can receive the data transmitted by the gateway 116. The data which is transmitted by the gateway 116 is the data formatted and which may be compressed by the data acquisition unit 110. As noted previously, the data within the data acquisition unit 110 may comprise the information collected from the various environmental sensors 104 such as temperature data and relative humidity data. The efficiency calculations system 120 may further receive data from the AMI backend system 126 which collects data from the various utility meters 114 as well as HVAC units 112. One of ordinary skill in the art also recognizes that the enhanced thermostat 109 may also have a communications link with each HVAC unit 112 similar to the communications link between the HVAC Unit 112 and the AMI backend system 126.

The efficiency calculation system 120 can compute various performance metrics based on all the data that it receives from the various devices within the system 100 such as the HVAC units 112, utility meters 114 and environmental sensors 104. The efficiency calculation system 120 can compute an energy efficient rating for the air-conditioning side of an HVAC unit 112, an R value which is a measure of thermal resistance for the entire building 101 as well as R values for each individual zone 102, a heat loss metric, an overall HVAC equipment efficiency metric, an energy consumption metric, as well as additional utility metrics. Further details of the efficiency calculation system 120 will be described below with respect to FIGS. 9 and 11.

The efficiency calculation system 120 can maintain and store data from multiple buildings 101 across large geographical areas. For example, the efficiency calculation system 120 can maintain a home owner historical database 122A as well as a comparison database 122B which sorts data by geography. With these databases 122A, 122B, the efficiency calculation system 120 can further provide performance metrics for the first building 101 compared against energy performance metrics of a plurality of similar second buildings 101 located in a specific geographical area such as a zip code as well as a performance metrics of the first building 101 against third buildings 101 located in groups of zip codes adjacent to the zip code of the first FIG. 101.

A further description of exemplary performance metrics will be described below with respect to FIGS. 2-5. The efficiency calculation system 120 can be implemented in hardware or software or both.

The efficiency calculation system 120 will generally comprise a computer server for supporting numerous client-based applications. The home efficiency product vendor backend system 124 can also comprise a computer server similar to the hardware or software (or both) of the efficiency calculations system 120.

According to one exemplary and preferred embodiment, the efficiency calculation system 120 in the form of a computer server can support numerous personal computers 106 of several different buildings 101. The efficiency calculation system 120 can send detailed energy metrics of the building 101 through the computer communications network 118 to the personal computer 106 for displaying to a user.

It is envisioned that the efficiency calculation system 120 will perform detailed and often complex calculations for the energy metrics of a building 101 so that the personal computer 106 can execute or run a thin client application that is not too memory or processor intensive. In this way, various types of personal computers 106 can be supported by the efficiency calculation system 120. Further, the efficiency calculation 120 could send energy metrics of the building 101 to other devices smaller than a typical personal computer 106 such as hand-held devices like personal digital assistance, cell phones, and other like hand-held units.

The efficiency calculations system 120 can communicate with the home efficiency product vendor backend system 124 through the communications network 118. The efficiency calculations system 120 can suggest vendors of particular services to the occupant of the building 101 based upon information that a building occupants can provide to the efficiency calculation system 120. The efficiency calculation system 120 can put in a request to the home efficiency product vendor backend system 124 if an occupant of the building 101 needs a particular service associated with improving the efficiency of the building 101. Further details regarding the efficiency calculation system 120 and its communications with the home efficiency product vendor backend system 124 will be discussed in further detail below in connection with FIG. 6 and FIGS. 10-11.

Referring now to FIG. 1B, this Figure is a functional block diagram illustrating a Region 137 adjacent to one or more zones 102 within a building 101 that can be taken into account for the energy efficiency metrics calculated by the system 100 of FIG. 1A according to one exemplary embodiment of the invention. In this figure, two additional environmental sensors 104D and 104E are positioned within the region 137 which is adjacent to zones 102C and zone 102A. In the exemplary embodiment illustrated in FIG. 1B, the region 137 can comprise an attic space relative to the two zones 102C, 102A. However, one of ordinary skill in the art recognizes that additional or different regions 137 are within the scope of the invention. For example, other regions 137 can include but are not limited to basements and crawl spaces that are typically positioned underneath buildings 101. The environmental sensors 104 are generally placed in the region 137 adjacent to their respective zone 102. The environmental sensors 104 illustrated in FIG. 1B are the same as the environmental sensors 104 illustrated in FIG. 1A.

Figure 2:
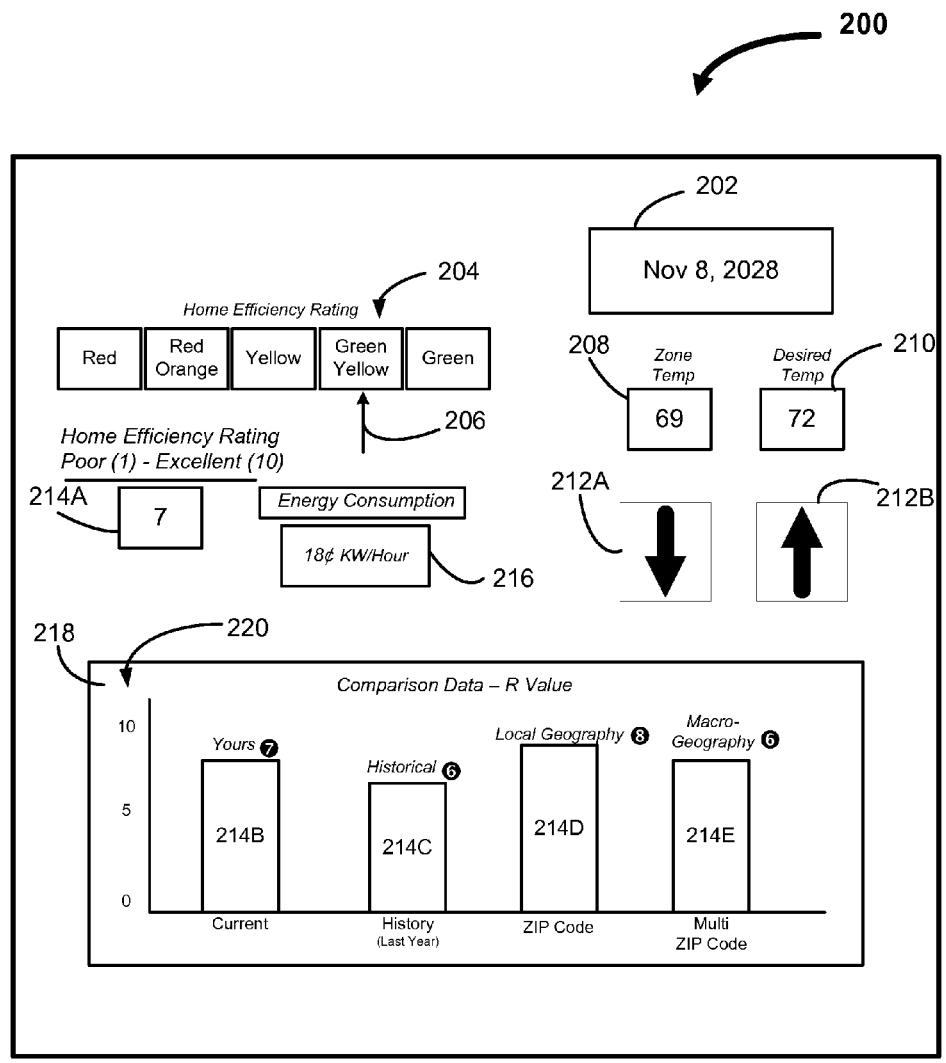
FIG. 2 illustrates a user interface for an exemplary thermostat illustrated in FIG. 1 according to one exemplary embodiment of the invention.

Referring now to FIG. 2, this figure illustrates a user interface 200 for an exemplary enhanced thermostat 109 illustrated in FIG. 1A according to one exemplary embodiment of the invention. While it's contemplated that these are user interface 200 illustrated in FIG. 2 will be used with the enhanced thermostat 109 of FIG. 1A, one of ordinary skill in the art recognizes that the user interface 200 could easily be used in connection with the personal computer 106 illustrated in FIG. 1A.

The user interface 200 can be produced by any number of display devices such as a liquid crystal displays (LCD). Conventional Cathod Ray Tube (CRT) Monitors can also support the User interface 200.

The user interface 200 can comprise a date display 202 as well as the current zone temperature 208 and a desired temperature 210 for the zone being displayed. In the exemplary embodiment illustrated in FIG. 2, the Zone temperature 208 and desired temperature 210 are conveyed in the Fahrenheit temperature scale, however, the temperature scale can also comprise the Celsius temperature scale. The zone temperature 208 in the exemplary embodiment illustrated in FIG. 2 is 69 degrees Fahrenheit and the desired temperature 210 of the zone is 72 degrees.

In addition to the zone temperature 208 and desired temperature 210 displays, the user interface 200 can further comprise climate control buttons 212 that can be activated by a user. The display device for the user interface 200 can comprise a touch screen display which can allow a user touch the respective temperature control buttons 212 in order to activate them. The first climate control button 212A is the button used to decrease the temperature in a respective zone period. The second button 212 which is an "up" arrow could be used to increase the temperature of a respective zone 102 or a plurality zones 102.

The User interface 200 can further comprise a home efficiency rating scale 204 that can convey efficiency ratings in a graphical manner. The home efficiency rating scale 204 can comprise a bar graph that includes multiple colored regions or areas to indicate certain levels of efficiency for a building 101. The colors can include, but are limited to, red, red-orange, yellow, green-yellow, and green. According to one exemplary rating scale the red and red-orange size of the efficiency scale 204 can indicate low levels of efficiency while green-yellow and green colors on the right side of the scale 204 can indicate higher levels and desired levels of efficiency for a building 101. The scale 204 can include a pointer 206 such as an arrow to indicate where a current home efficiency rating for a zone 102 or throughout the other zones exist. One of ordinary skill in the art further recognizes that a liquid crystal display and the colors described above could be illuminated or activated so that each region or square illustrated in the scale 204 could be filled with a particular color to indicate that the level for a particular region has been met by a zone 102 or plurality of zones 102 within a building 101. Other graphical scales besides bar graphs could be employed without departing from the scope of the invention.

For example, the home efficiency rating could also comprise a numerical display 214A in order to convey a home efficiency rating to the user through the user interface 200. In the exemplary embodiment illustrated in FIG. 2, the home efficiency rating is a "seven" on a rating scale of 1 to 10 in which a level of one indicates very poor efficiency while a level of ten indicates a high or excellent level of efficiency. However, other graphical means not illustrated in user interface 202 are within the scope of the invention.

In addition to the home efficiency rating scales 204 and 214A, the user interface 200 can further comprise an energy consumption display 216. The energy consumption display 216 can convey current levels for consumption of a particular utility. For example, in the exemplary embodiment illustrated in FIG. 2, the energy consumption display 216 is listing a consumption of electricity for a particular building 101. In the exemplary embodiment illustrated in FIG. 2, an exemplary rate of 18 cents per kilowatt hour is shown. However, one of ordinary skill in the art recognizes that alternative energy consumption displays 216 are within the scope of the invention. For example, the energy consumption display could convey information related to other utilities such as gas, propane, oil, water and other like utilities of a conventional building 101.

The user interface 200 may further comprise relative energy efficiency performance data 218 for the exemplary embodiment illustrated in FIG. 2. The relative energy performance data can comprise data involving R values calculated for a building 101. R values can correspond to the R value display 214A discussed above. However, the R values shown in the energy efficiency performance data 218 include relative values that compare the R value of a single building 101 compared to other buildings 101 in a local geography as well as a macro-geography.

Specifically, the energy efficiency performance data 218 comprises a scale 220 ranging between 0 and 10 similar to the R value scale discussed above with the respect to the R value 214A. The efficiency performance data 218 further comprises four bar graphs 214B-214E. The first bar graph 214B corresponds to the R value for the building 101 in which the user interface 200 controls. This first bar graph 214B has an R value with a magnitude of 7 which corresponds to the single-digit display 214A of the R value mentioned above. The second bar graph 214C can correspond to an R value of a building 101 that is historical in nature.

For the exemplary embodiment illustrated in FIG. 2, the second bar graph 214C can convey an R value for the building 101 that is one year old. However one of ordinary skill in the art recognized that other historical values are not beyond the invention. For example, the historical bar graph 214C could convey and R value of a building 101 that is one day old, a month, a few months old, or an average over time such as an average over several years.

The third bar graph 214D can convey an average of R values taken from Buildings 101 in a local geography relative to the building 101 containing the enhanced thermostat 108. One example of a local geography can include those buildings 101 within a same coastal zip code. In the exemplary embodiment illustrated in FIG. 2, the third bar graph 214D has a magnitude of eight for its R Value.

The fourth bar graph 214E can convey an average R value with the respect to multiple buildings within a macro-geography. One example of a macro-geography can comprise buildings 101 within a plurality of zip codes such as in a city or metropolitan area. Another example of a macro-geography could comprise buildings 101 within a state or country. With the relative energy efficiency performance data 218, an occupant of a building 101 can determine if the level of efficiency performance for a particular building 101 is within acceptable range or within the norm for other buildings 101 in a particular geographic region.

For the example illustrated in FIG. 2, the particular building 101 has an R value of seven and a historical R Value of six. Meanwhile, buildings 101 in a local geography have an R value of eight and buildings within a macro-geography have a R value of 6. With this exemplary data, the occupant of a building 101 would understand that the R value for the particular building 101 falls generally within an acceptable range relative to other buildings 101 within the local and macro-geographies. The efficiency calculations system 120 can provide all of these values for the bar graphs 214 in this relative energy efficiency performance data 218.

While R values were described in connection with the example of FIG. 2, one of ordinary skill in the art recognized that other relative energy performance data 218 could be conveyed without departing from the intervention. In other words, one of ordinary skill in the art recognized that other types of graphs and other types of data such as energy efficiency ratings (EER) for air conditioners, heat loss calculations, HVAC efficiency metrics, energy consumption data, and other data could be provided in the relative energy efficiency performance data 218 without departing from the invention. Additionally, the efficiency calculations system 120 could also group buildings 101 according to certain classifications.

For example, the efficiency calculation system 120 could group similar buildings 101 according to their status as either residential or commercial. Further classifications could be made such as the square footage present within each particular building 101. The efficiency calculations system 120 could group buildings 101 together, but have similar ranges of square footage. Other classifications or groupings of buildings 101 could be made without departing from the invention. In this way, the relative energy efficiency performance data 218 with comparing similar buildings 101 to one another. This would eliminate the potential of the efficiency calculations system 120 comparing efficiency performance data between a small residential building 101 and a large commercial building 101.

Figure 3:
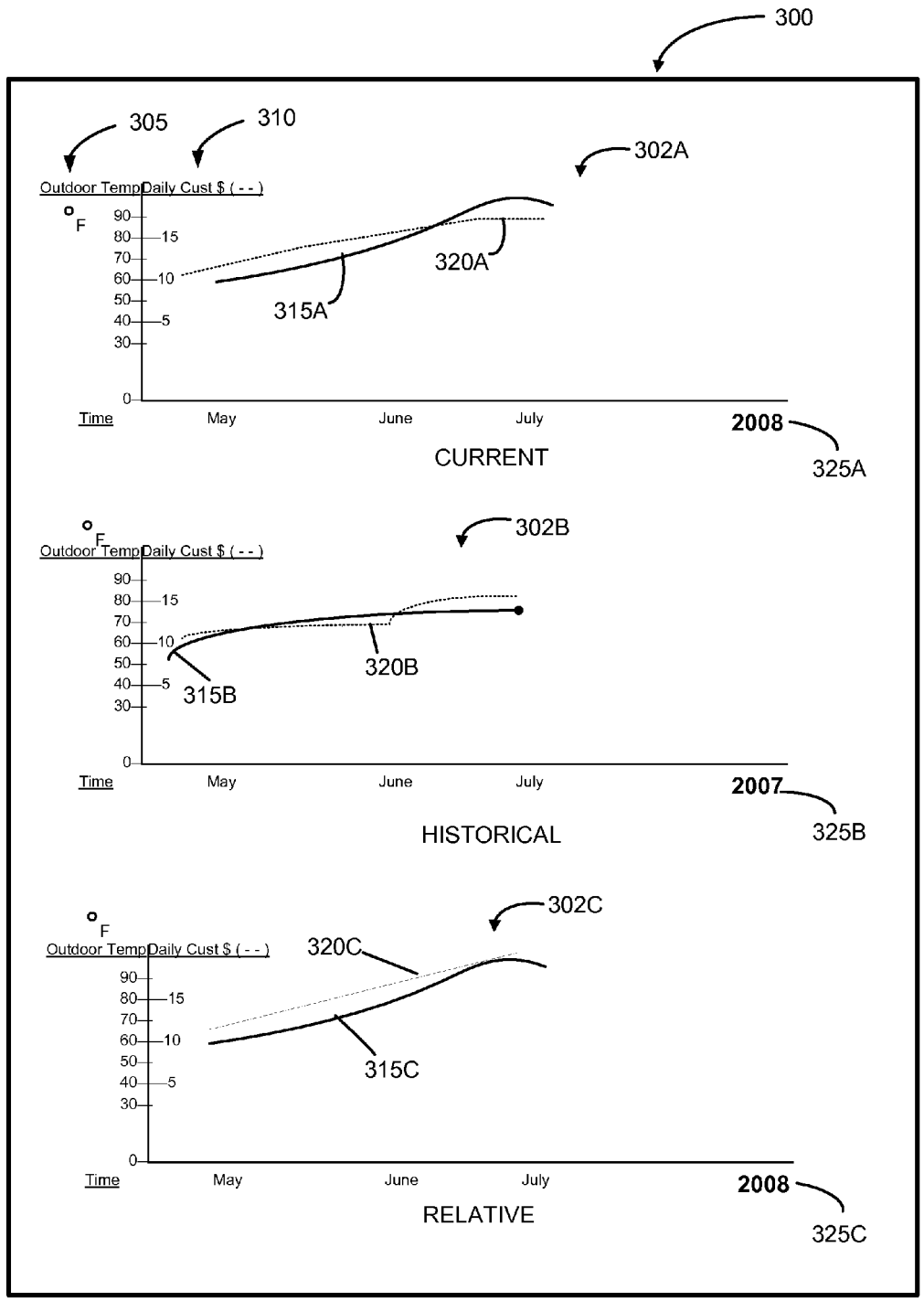
FIG. 3 is a group of graphs illustrating outdoor temperature ranges over a period of time as well as energy cost over time of a user interface according to one exemplary embodiment of the invention.

Referring now to FIG. 3, this figure is a user interface 300 providing a group of graphs 302 illustrating outdoor temperature ranges 315 over a period of time 325 as well as energy costs 320 over the same period of time 325 according to one exemplary embodiment of the invention. The user interface 300 can be provided on either the enhanced thermostat 109 or personal computer 106 of FIG. 1A.

The first graph 302A provides a plot of outdoor temperature ranges 305 and daily energy costs 315 versus a period of time 325. This period or span of time illustrated in FIG. 3 comprises three months such as the months through May-June of the year 2008. One of ordinary skill in the art recognizes that other temperature ranges, other scales for cost, and other spans or periods of time may be selected without departing from the scope of the invention. In this first graph 302A the solid line 315A correspondence with the outdoor temperature scale 305. The solid line 315A indicates the daily temperature as measured by the outdoor environmental sensor 104D as illustrated in FIG. 1A for the months of May-July of the year 2008. In the exemplary embodiment illustrated in FIG. 3, the initial May temperature starts at approximately fifty-five degrees Fahrenheit and goes to approximately eighty-one degrees Fahrenheit in July 2008. Meanwhile, the dashed-line 320A of the first graph 302A corresponds with the daily energy costs scale 310.

The second graph 302B depicts data similar to that illustrated in the first graph 302A except that the time-range 325B corresponds to a previous year for a particular building 101. In other words, the second graph 302B provides a plot of daily outdoor temperature and daily energy costs against a span of time for a particular building approximately one year ago relative to the time period 125A illustrated in the first graph 302. One of ordinary skill in the art recognizes that similar to first graph 302A, the magnitude of the scales for the second graph 302B can be varied without departing from the invention. For example, the time-period 325B can be adjusted by the user to include more or less historical type periods than those which are illustrated. Similarly, different values for the X-axis could be selected besides the daily outdoor temperature range and daily costs range which are illustrated. For example, the X-axis could be provided with a range of R Values or energy efficient ratings (EER) for air conditioners without departing from the invention.

In the third graph 302C, a similar plot of daily outdoor temperature 305 and daily costs 310 against a time period 325C is illustrated. However, this third graph 302C can comprise data taken from a plurality of buildings 101 within a local geography or a macro-geography as described above with respect to FIG. 2. That is, the solid line 315C could represent the daily outdoor temperature adjacent to a plurality of buildings within a local geography or a macro-geography and a the dashed-line 320 could be an average energy costs taken from a plurality of buildings 101 and a local or macro-geography. All of these graphs 302 could be produced by the efficiency calculation system 120 as described above in connection with FIG. 1A. With this current data, historical data, and relative data an occupant of a building 101 can assess the relative energy efficiency performance of a particular building 101. In this way, an occupant of a building 101 will have a fairly good measure to determine if further improvements are needed to the building 101 in order to increase a building's energy efficiency performance relative to other buildings 101 within a local or macro-geography.

Figure 4:
FIG. 4 illustrates a user interface for a thermostat or personal computer which is displaying a summary of energy metrics for a building according to one exemplary embodiment of the invention.

Referring now to FIG. 4, this figure illustrates the user interface 400 for an enhanced thermostat 109 or personal computer 106 which is displaying a summary of energy metrics for a building 101 according to one exemplary embodiment of the invention. In this exemplary user interface 400, three categories of data can be displayed: a data set for all zones 102 of a building 101; a first zone 102A; and a third zone 102C. For the data set addressing all of these zones 102, the first entry can comprise an energy efficiency ratio (EER) 402 that may relate the efficiency to one or more air conditioners which cool the zones 102 of a building 101. This EER performance rating is defined by the air conditioning, heating, and refrigeration institute in its standard ARI 210-240-2008. However, other air conditioning performance metrics are within the scope of the invention.

Another value can comprise a heat loss value 404. A heat loss rate estimate can be computed when the heating/cooling system is disabled by measuring the change in room temperature over time. The observed change in temperature, can be multiplied by the number of cubic feet and the theoretical number of BTUs per cubic foot, per degree F. (this is approximately 0.0182 BTU/(ft$^3$F)), to yield the number of BTUs lost over the period. This is the estimate heat loss. Because heat loss rate is dependent on the indoor-outdoor temperature differential, it is useful to compute the heat loss per degree-day. Heat loss per degree-day is the amount of heat that is expected to be lost over the course of a day where the indoor-outdoor temperature differential is 1 degree F. This can be computed by dividing the observed heat loss by the average indoor-outdoor temperature differential and multiplying by a conversion factor to scale to a 24-hour period.

A third entry in the all zone category can comprise an R-value. The R-value 214 can be a measure of thermal resistance measured in feet squared, degrees Fahrenheit, hrs, per BTU (ft$^2$ F hr/BTU). Generally, the bigger the R-value, the better the building insulation's effectiveness. An R-value typically only covers conducted heat and is usually not a measure of a building's insulation's materials qualities as a radiant barrier. For this system, the term R-value is used to express the aggregate thermal insulating properties of the building. To determine the R-value, the internal surface area of the zone/building is multiplied by the observed temperature change (during a period of heating/cooling inactivity) and divided by the heat loss previously computed. This computation yields an estimated effective R-value for the zone/building.

A fourth value under the all zone category in the user interface 400 can comprise an energy consumption value 216 that may display electrical energy consumption as well as a gas consumption for a particular building 101. The exemplary embodiment illustrated in FIG. 4, the electricity consumption is shown as 18 cents a kilowatt/hour. The gas consumption is illustrated as 20 cubic feet/hour. One of ordinary skill in the art recognizes that other utility rates could be illustrated without departing from the scope of the invention.

A fifth value that can be determined is the heating/cooling power in BTU/hr for the active heating/cooling system. After a baseline heat loss rate is established, the change in temperature for a zone/building can be observed while the heating/ cooling system is active. The heat loss (gain) rate during this period is the sum of the heating/cooling power of the heating/cooling system and the heat loss baseline. Therefore, an estimate of the heating/cooling power of the system (BTU/hr) can be computed by subtracting the baseline heat loss from the heat loss (gain) during the period of heating/cooling activity.

A sixth value under the all zone category can comprise the heating/cooling system's energy efficiency ratio (EER) for the air conditioner or furnace BTU/(W hr). This can be computed by dividing the observed heating/cooling power divided the electrical power consumed during that period of observation. This computation can also be carried out for other energy sources (i.e. natural gas furnace).

Like the air conditioner efficiency value 406, the user interface 400 can also display a furnace efficiency 408 under the all zone category of the user interface 400. Next, underneath these efficiency metrics for the category of all zones, a $7^{th}$ value can comprise a zone size value 410. This zone size value 410 can indicate the size of livable space within a typical building 101. Typically, the occupant of a building 101 is prompted to input a proximate size of all the zones 102 together for a particular building 101.

The user interface 400 of FIG. 4 further includes metrics for particular zones 102 of a building 101. In the exemplary embodiment illustrated in FIG. 4, zone A and zone C are profiled. Based on the data which is collected from the environmental sensors 104 in each respective zone 102 as well as any environmental sensors 104 which are positioned adjacent to the zones such as environmental zones 104D, 104E as illustrated in FIG. 1B, efficiency calculations 120 can provide specific energy efficiency performance metrics that are tailored to a particular zone 102 within the building 101. Each zone-based set of energy efficiency performance metrics can be similar or the same as what is described above with respect to the all zone category. That is, zone specific energy efficiency performance metrics can comprise, but are not limited to, an EER performance value 402A, the heat loss value 402B, a R-value 214A1, and a zone size (in squared units such as square feet or square meters).

The efficiency calculation system 120 can compare the metrics of individual zones 102 and can compare them to all of the zones within a building 101 in order to determine if any particular zone 102 is less efficient relative to other zones 102. For example, the efficiency calculation system 120 can compare the EER performance value 402A of the first zone 102A to the EER performance value 402C of the third zone 102C. As illustrated in FIG. 4, the EER performance value 402A of the first zone 102A has a magnitude of 7 while the EER performance 402C of the third zone 102C has a magnitude of 3. Based on these two metrics alone, the efficiency calculation system 120 could determine that the third zone 102C may have some potential sources of energy losses. The efficiency calculation system 120 can also compare the energy efficiency performance metrics to the values for the all zone category to determine whether a particular zone 102 may have potential sources for energy losses. Similarly, the efficiency calculation systems 120 can also compare one zone relative to another zone in addition to comparing each zone 102 to the all zone category metrics.

Referring now to FIG. 5, this figure illustrates a user interface 500 for an enhanced thermostat 109 or a personal computer 106 which is displaying suggested input from an occupant of a building 101 for a particular zone 102 within the building 101 according to one exemplary embodiment of the invention. The user interface 500 can display a size of a zone 102 which is a particular focus of the user interface 500. This size of the zone 102 can be expressed in a form of squared units, such as squared meters or squared feet. Alternatively, the size of the zone can be expressed in terms of cubic units such as cubic feet. The user can input the size of each zone during system set up.

In the exemplary embodiment illustrated in FIG. 6, the third zone 102C is being analyzed and is shown to have an area of approximately 1,000 cubic feet. As noted above, this zone size is typically entered in by an occupant of the building 101 when the system 100 is initialized.

Under the displayed area, the remainder of the user interface 500 can prompt the user for specific input for the particular zone of interest. The zone of interest may be identified by the efficiency calculation system 120 after the metrics as illustrated in FIG. 4 are assessed by the efficiency calculation system. As noted above, the third zone 102C as illustrated in FIG. 4 has lower energy efficiency performance relative to the first zone 102A and relative to the category of all zones illustrated at the top of the user interface 400 in FIG. 4.

Exemplary input that may be suggested by the efficiency calculation system includes, but is not limited to, the following information: the number of windows in the zone of interest 502; the number of doors in the zone of interest 504; the number of months since the seals around a door (if doors exist in the zone of interest) 506; the number of months owed for the age of windows (if present within the zone of interest) expressed in the number of months 508; the number of windows (if present in the zone of interest) facing the southward direction 510; the number of windows (if present within the zone of interest) facing north 512; the type of windows as selected from a list 514; the number of ceiling fans in the zone of interest 516; and a height of the zone of interest expressed in certain units such as feet or meters 518.

Other suggested input not illustrated in FIG. 5 is within the scope of the invention. For example, other suggested input to assess the potential sources of energy efficiency performance problems can include, the type of insulation surrounding a particular zone of interest; the estimated R-value for the insulation surrounding the zone of interest; the type of building materials which form the walls and ceiling of the zone of interest; and other similar information as it relates to the energy efficiency performance for a zone of interest.

Referring now to FIG. 6, this figure illustrates a user interface 600 for an enhanced thermostat 109 or a personal computer 106 which is displaying recommendations 602, 604 to improve energy performance for a particular zone 102 within a building 101 according to one exemplary embodiment of the invention. The user interface 600 can be generated by the efficiency calculation system 120 after the system 120 analyzes the input taken from the user interface 500 in FIG. 5. If the heat loss for a zone is high relative to other zones in the dwelling, suggestions can be made to the owner based on the input from user interface 500. For example, if the zone's windows have not been inspected for an extended period, the owner would be prompted to check for drafts that may be contributing to excessive heat loss.

Many different types of recommendations can be provided by the efficiency calculation system 120. The recommendations illustrated in FIG. 6 are only examples of the type of recommendation that can be made by the efficiency calculations systems 120. One exemplary recommendation 602, is a recommendation by the efficiency calculation system 120 for the occupant of the building 101 to replace two south facing windows with tinted, aluminum/glass type window which may provide a heat loss saving of 100 BTU/hour. Another exemplary recommendation can include the second recommendation 604 which is to provide a ceiling fan in the third zone see 102C in which the fan may have an energy consumption of an exemplary five cents per kilowatt per hour but within an approximate heat loss savings of at least 50 BTU/hours. Alternatively, instead of the specific values described above, the system 120 could quote industry averages for efficiency improvements to show the value in replacing windows, doors, etc.

In addition to the recommendations 602, 604 that can be made by the efficiency calculation system 120, the efficiency calculation system 120 can also ask the occupant of the building 101 if he or she will need the services of a professional contractor in the field corresponding to the recommendations 602, 604 that were made. So in the exemplary embodiment illustrated in FIG. 6, the efficiency calculation system 120 can prompt the occupant of the building 101 if he or she would like to see or meet with a window contractor. If the occupant of the building 101 answers such an inquiry in the affirmative, the efficiency calculation system 120 can contact the backend server 124 of the home efficiency product vendors to prompt that system to schedule that service call to the occupant of the building 101.

Figure 7:
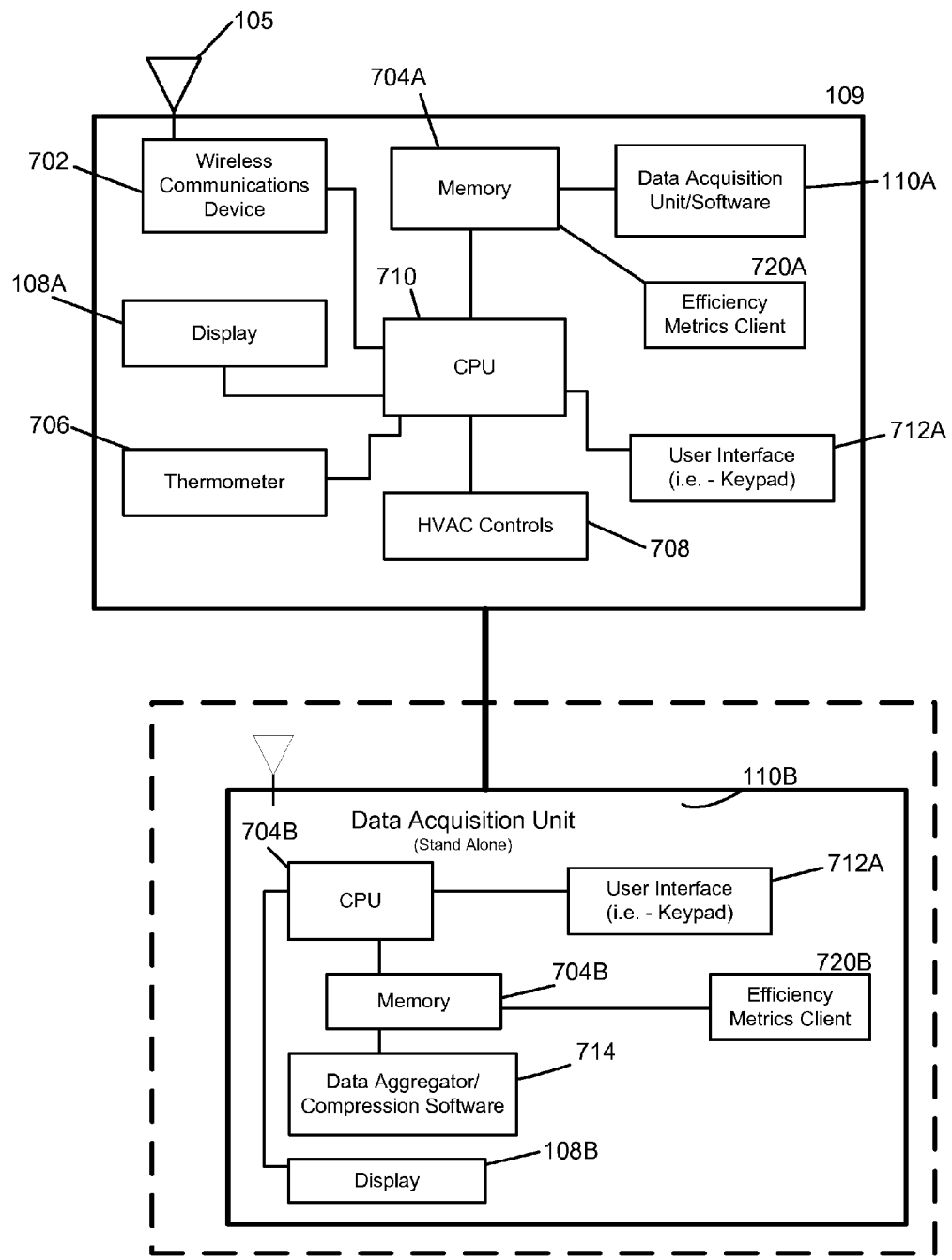
FIG. 7 is a functional block diagram illustrating some exemplary details for the an enhanced thermostat and a data acquisition unit according to one exemplary embodiment of the invention.

Referring now to FIG. 7, this figure is a functional block diagram illustrating some exemplary details for an enhanced thermostat 109 and a data acquisition unit 110 according to one exemplary embodiment of the invention. The central processing unit (CPU) 710 of the enhanced thermostat 109 can be coupled to a thermometer 706, which is designed to track internal or inside temperature relative to the building 101. And specifically, the thermometer 706 can track the internal temperature of the second zone 102B as illustrated in FIG. 1A. The CPU 710A can also be coupled to a display 108A that can comprise one of many different types of displays. For example, display 108A can comprise a liquid crystal display (LCD) screen as well as a light emitting diode (LED) display. The display 108A can support text as well as graphics so that the user interfaces 200, 300, 400 can be provided to a user.

The CPU 710A can be coupled of FIGS. 2-4 to a user interface 712 such as a keypad. The CPU 710A can also be coupled to heating, ventilation and air conditioning (HVAC) controls 708 controlling various environmental equipment of the building 101, such as furnaces, heat pumps, and air conditioning units. The CPU 710A can be coupled to memory 704A. The memory 704A can comprise any type of machine-readable medium. Any machine-readable medium can include, but is not limited to, floppy diskettes, optical disks, CD-ROMs, magnito-optical disk ROMs, RAMs, EPROMs, EEPROMs, magnetic or optical cards, flash memory, or any other type of media/machine-readable medium suitable for storing electronic instructions for the CPU 710.

The CPU 710A can also communicate with a data acquisition unit 110A that can comprise either hardware or software or both. According to a first exemplary embodiment, the data acquisition unit 110A can be contained within the enhanced thermostat 104B. The data acquisition unit 110A is responsible for formatting and compressing any data from the plurality of environmental sensors 104 that are positioned throughout the building 101. The data acquisition unit 110A can also be responsible for formatting any of the environmental sensor data according to predefined protocols that can be understood by the gateway 116 as illustrated in FIG. 1A. When the data acquisition unit 110A executes software, such software can be stored within the memory 704A and executed by the CPU 710 as needed. According to a second alternative exemplary embodiment, the data acquisition unit 1108 can be confined within a separate housing relative to the enhanced thermostat 109. According to the second exemplary embodiment, the data acquisition unit 1108 can comprise its own central processing unit 710B as well as its own data aggregator and/or compression software 714. This data acquisition unit 1108 according to the second embodiment may also comprise its own memory 704B and its own separate display 108B relative to the display 108A of the enhanced thermostat 109. The data acquisition unit 1108 is illustrated within a dashed box to demonstrate that this exemplary embodiment is optional and is particularly not used if the data acquisition unit/software 110A is included in the housing for the enhanced thermostat 109.

The CPU 710A can be coupled to a wireless communication device 702. The wireless communication device 702 can comprise a packet radio and can support the wireless communication protocols discussed above with respect to FIG. 1A. For example, one exemplary protocol is the Zigbee wireless communication protocol. The wireless communication device 702 can further comprise an antenna 1058.

And lastly, the CPU 710A can support an efficiency metrics client software or hardware (or both) 720. The efficiency metrics client 720A a "thin" low memory intensive software or hardware that can receive the data which is used to support the user interfaces 200, 300, 400, 500, and 600, as illustrated in FIGS. 2-6. The efficiency metrics client 720 is designed to communicate with the efficiency calculation system 120. The efficiency metrics client 720 allows a user to enter data through the user interface 712A, B. Such data can include, but is not limited to, the requested data displayed in user interface 500 and user interface 600 as illustrated in FIGS. 5 and 6 above.

Figure 8:
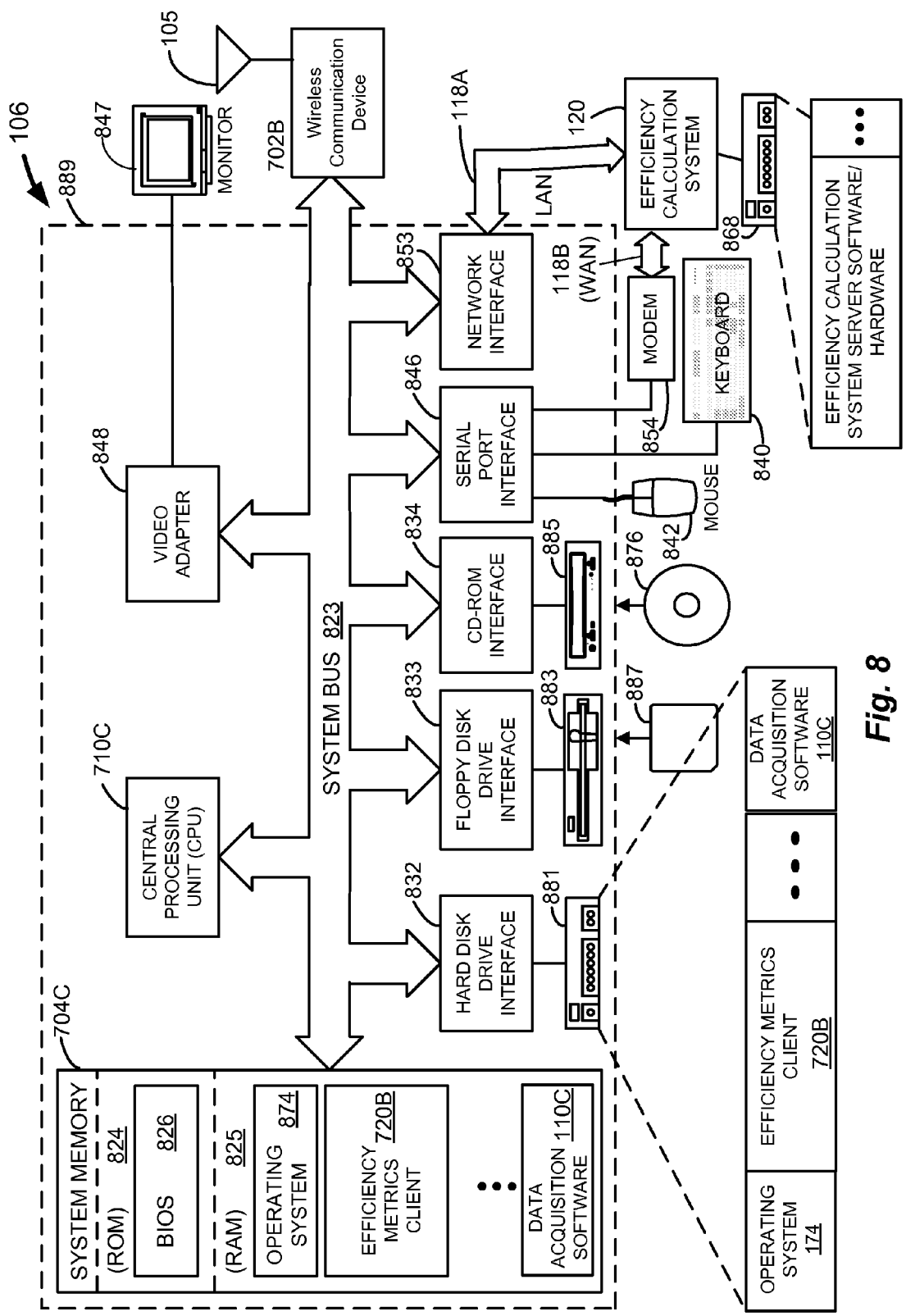
FIG. 8 is a functional block diagram of a personal computer that can be used in the system according to one exemplary embodiment of the invention.

Referring now to FIG. 8, this Figure is a functional block diagram of a personal computer 106 that can be used in the system 100 according to one exemplary embodiment of the invention. The exemplary operating environment for the system 100 includes a general-purpose computing device in the form of a conventional computer 106. Generally, the computer 106 includes a processing unit 710C, a system memory 7040, and a system bus 823 that couples various system components, including the system memory 704C to the processing unit 710C.

The system bus 823 may be any of several types of bus structures, including a memory bus or memory controller, a peripheral bus, and a local bus using any variety of bus architectures. The system memory 704C includes a read-only memory (ROM) 824 and a random access memory (RAM) 825. A basic input/output system (BIOS) 826 containing the basic routines that help to transfer information between elements within the computer 106, such as during start-up, is stored in ROM 824. Computer 106 further includes a hard disk drive 881 for reading from and writing to a hard disk, not shown, a magnetic disk drive 883 for reading from or writing to a removable magnetic disk 887, and an optical disk drive 885 for reading from or writing to a removable optical disk 876 such as CD-ROM/DVD-ROM, or other optical media. Hard disk drive 881, magnetic disk drive 883, and optical disk drive 885 can be connected to the system bus 823 by a hard disk drive interface 832, a magnetic disk drive interface 833, and an optical disk be drive interface 834, respectively.

While the exemplary embodiment described herein employs a hard disk drive 881, removable magnetic disk 887, and removable optical disk 876, it should be appreciated by one of ordinary skill in the art that other types of computer readable media which can store data that is assessable by a computer 106, such as magnetic cassettes, flash memory cards, digital video disks, Bernuulli cartridges, RAMs, ROMs, and the like, may be used in the exemplary operating environment of the system 100. The drives and their associated computer readable media provide nonvolatile storage of computer-executable instructions, data structures, program modules, and other data for the computer 106.

A number of program modules may be stored on the hard disk 881, magnetic disk 887, optical disk 876, ROM 824, or RAM 825, including an operating system 874, an efficiency metrics client 720B, and data acquisition software 110C. Program modules include routines, sub-routines, programs, objects, components, data structures, etc., which perform particular tasks or implement particular abstract data types. Aspects of the present invention may be implemented in the form of the efficiency metrics client 720B communicating with the efficiency calculation system software or hardware (or both) of the efficiency calculation system 120.

The user may enter commands and information into the computer 106 through input devices such as a keyboard 840 and a pointing device 842. Pointing devices 842 may include a mouse, a track ball, and an electronic pen that can be used in conjunction with an electronic tablet. Other input devices 842 (not shown) may include a microphone, joy stick, satellite dish, touch screen display, or the like. These and other input devices 842 are often connected the processing unit 710C through a serial port interface 846 that is coupled to the system bus 823, but it may be connected to other interfaces, such as a parallel port, game port, a universal serial bus (USB), or the like. A display device 847 may also be connected to the system bus 823 via an interface, such as a video adapter 848. In addition to the monitor 847, computers typically include other peripheral output devices (not shown), such as speakers and printers.

The computer 106 may operate in a networked environment using logical connections to one or more remote computers, such as the efficiency calculation system 120. The remote computer may be another personal computer, a server, a client, a router, a network PC, a peer device, or other common network node. While a remote computer typically includes many or all of the elements described above relative to the computer 106, only a memory storage device 868 and relevant hardware or software has been illustrated in FIG. 8. The logical connections depicted in FIG. 8 include a local area network (LAN) 118A and a wide area network (WAN) 118B. Such networking environments are commonplace in offices, enterprise-wide computer networks, intranets, and the Internet.

When used in a LAN networking environment 118A, the computer 106 is often connected to the local area network 118A through a network interface or adapter 853. When used a WAN networking environment 1188, the computer 106 typically includes a modem 854 or other means for establishing communications over WAN 1188, such as the Internet. The modem 854, which may be internal or external, is connected to the system bus 823 via a serial port interface 846. In a networked environment, program modules depicted relative to the computer 106, or portions thereof, may be stored in the remote memory storage device 868. It will be appreciated that the network connections shown are exemplary and other means of establishing communications links between the computers 106 and 120 may be used.

Moreover, one of ordinary skill of the art will appreciate that the present invention may be implemented in other computer system configurations, including hand-held devices, multiprocessor systems, microprocessor based or programmable consumer electronics, networked personal computers, minicomputers, mainframe computers, and the like. The invention may also be practiced in distributed computing environments, where tasks are performed by remote processing devices that are linked through a communications network such as LAN 118A and WAN 118B. In a distributed computing environment, program modules may be located in both local and remote memory storage devices.

Figure 9:
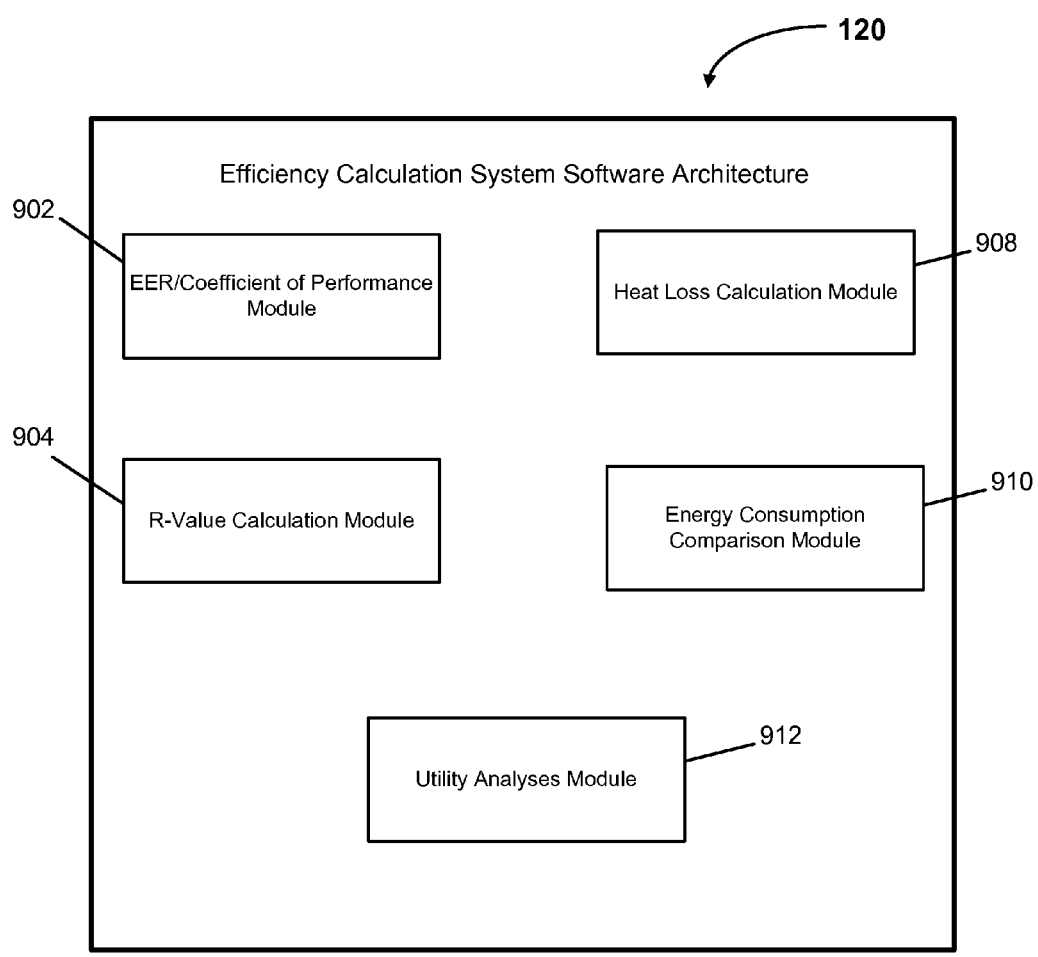
FIG. 9 is a functional block diagram exemplary software architecture for the efficiency calculation system of FIG. 1 according to one exemplary embodiment of the invention.

Referring now to FIG. 9, this figure is a functional block diagram illustrating an exemplary software architecture for the efficiency calculation system 120 according to one exemplary embodiment of the invention. The efficiency calculation system 120 can comprise several different program modules such as an EER or energy efficiency rating performance data 902, an R-value calculation module 904, a heat loss calculation module 908, an energy consumption comparison module 910, and a utility analytics module 912. The energy efficiency performance data 902 may comprise values provided by the manufacturer of the HVAC equipment that is usually placed on the HVAC equipment. The R-value Calculation Module 904 computes the R-Value by multiplying the user-input surface area of defined zones or the overall dwelling by the observed temperature change, divided by the observed heat loss.

The Heat Loss Calculation Module 908 computes the heat loss rate by observing the measured temperature change and multiplying by the volumetric heat capacity of air (BTU/F ft$^3$). The Energy Consumption Comparison Module 910 provides a means of querying the database of computed metrics (902, 904, 908, and 912) based on geography, dwelling type or other database parameter, and compares those values. A number of statistical comparisons can be made between a single dwelling and the population returned by the query (e.g. difference from population mean, decile rank). The utility analysis module 912 logs and records utility consumption for use in EER/Coefficient of Performance Module 902.

Figure 10A:
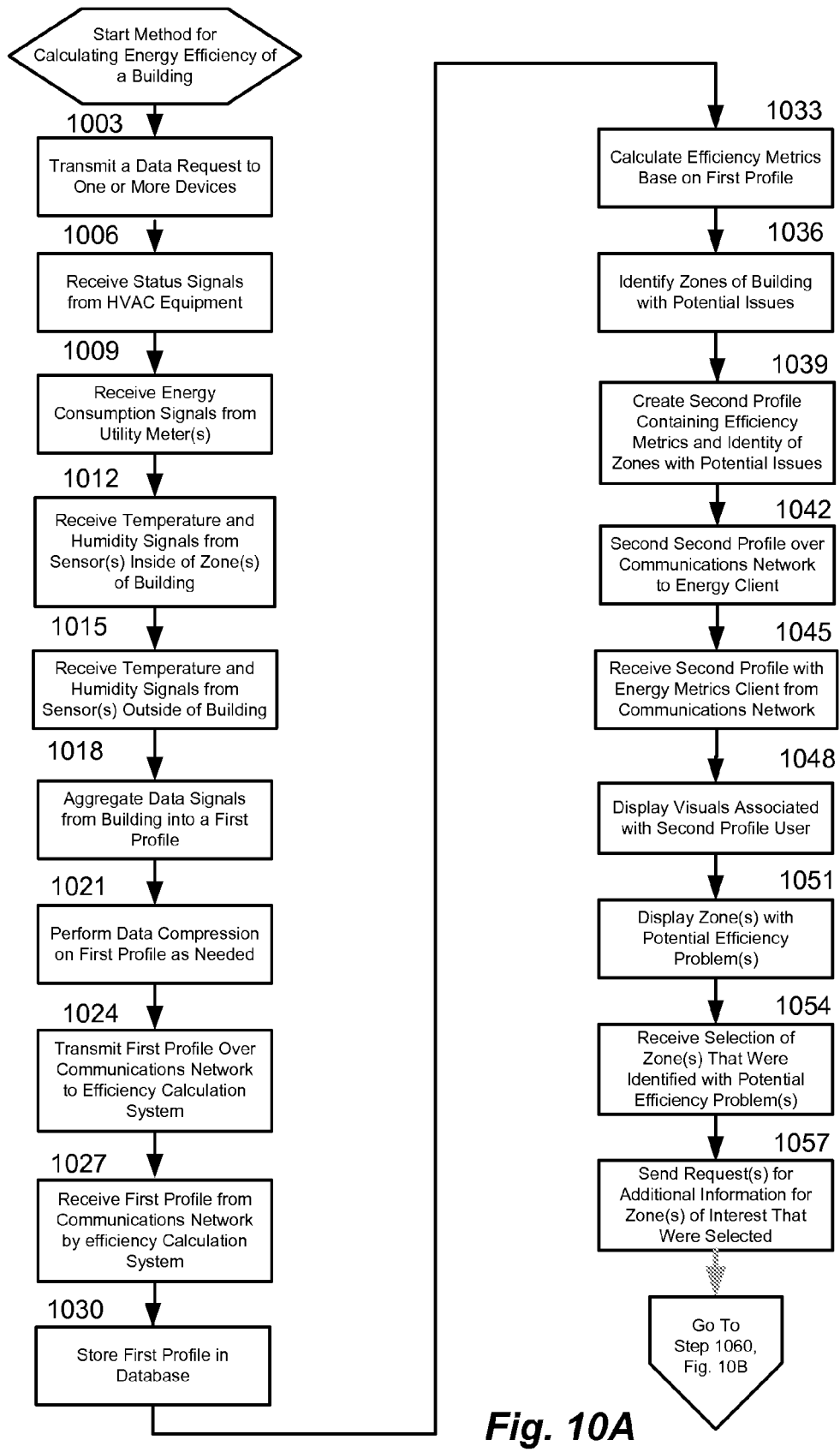
FIG. 10A is a logic flow diagram illustrating an exemplary method for calculating energy efficiency metrics of a building and one or more zones within a building according to one exemplary embodiment of the invention.

Referring now to FIG. 10A, this figure is a logic flow diagram illustrating an exemplary method 1000 for calculating energy-efficiency metrics of a building 101 and one or more zones 102 within the building 101 according to one exemplary embodiment of the invention. One of ordinary skill in the art will appreciate that the process functions of the steps described in this figure and the remaining flow chart figures may be executed by firmware in combination with a microcontroller, a microprocessor, a digital signal processor, or a state machine implemented in an application-specific integrated circuit (ASIC), programmable logic, or other numerous forms of hardware and/or software without departing from the scope of the invention.

In other words, the steps illustrated in FIG. 10A and the remaining logic flow diagrams of the disclosure may be provided as a computer program which may include a machine-readable medium having stored thereon instructions which may be used to program a computer (or other electronic device) to perform the process according to the invention. The machine-readable medium may include, but is not limited to, optical disk, CD-ROMs, DVD-ROMs, magneto optical disks, ROMs, RAMs, EEPROMs, magneto optical cards, flash memory and other types of media/machine-readable medium suitable for storing electronic instructions.

Certain steps in the processes or process flow described in all of the logic flow diagrams of this disclosure must naturally proceed others for the invention to function as described. However, the invention is not limited to the order of steps described if such order or sequence does not alter the functionality of the present invention. That is, it is recognized that some steps may be performed before, after, or parallel to other steps without departing from the scope and spirit of the invention. Further, one of ordinary skill in programming will be able to write such a computer program or identify appropriate hardware or circuits to implement the disclosed invention without difficulty based on the flow charts and associated description in the application text, for example.

Therefore, disclosure of a particular set of program code instructions or detailed hardware devices are not considered necessary for an adequate understanding of how to make or use the invention. The inventive functionality of the claimed computer-implemented process will be explained in more detail in the following description and in conjunction with the remaining figures illustrating the other processes.

Step 1003 is the first step n the method 1000 for calculating energy efficiency metrics of a building 101. In this first Step 1003, the data acquisition unit 110 of FIG. 1A may submit a request for data to one or more of the environmental sensors 104. In other words, data acquisition unit 110 can periodically poll the environmental sensors 104 for environmental data. However, one of ordinary skill in the art recognizes that the environmental sensors 104 can be programmed to transmit data to the data acquisition unit 110 at certain time periods so that the data acquisition unit 110 does not need to actively poll each environmental sensor 104. In such a scenario, the first Step 1003 could be eliminated if the environmental sensors 104 are programmed to transmit their data on a periodic basis.

In Step 1006, the data acquisition unit 110 can also receive status signals from the HVAC equipment 112 as illustrated in FIG. 1A. The data acquisition unit 110 can receive the status signals from HVAC equipment 112 directly or through the advanced metering infrastructure (AMI) 126 if the HVAC equipment 112 is designed to only communicate with the AMI backend system 126. The status signals from the HVAC equipment 112 can indicate a current energy consumption as measured by the HVAC equipment 112. As noted previously, the HVAC equipment 112 can include, but is not limited to, furnaces, air conditioners for central air conditioning systems, window-type air conditioners, heat pumps, and other similar HVAC equipment 112.

In Step 1009, the data acquisition unit 110 can receive energy consumption signals from utility meters 114 as illustrated in FIG. 1A. The data acquisition unit 110 can receive these energy consumption signals directly from the utility meters 114 or indirectly through the AMI backend system 126. These energy consumption signals can indicate current rates of consumption such as consumptions for natural gas, heating oil, electricity for air conditioners, in addition to water consumption by occupants of the building 101.

In Step 1012, the data acquisition unit 110 can receive temperature and relative humidity signals from the environmental sensors 104 inside of the one or more zones of the building 101. Similarly, in Step 1015, the data acquisition unit can receive temperature and relative humidity signals from the environmental sensors 104 which are positioned outside of the building 101. As noted previously, the data acquisition unit 110 can poll each of the environmental sensors 104 or alternatively or in combination the environmental sensors 104 can be programmed to send signals to the data acquisition 110 on a periodic basis such as hourly, every minute, every second, etc.

One of ordinary skill in the art will recognize that Steps 1003 through 1015 can be performed in parallel or in a different order without departing from the scope of the invention. Next, in Step 1018, the data acquisition unit 110 can aggregate all of the data signals from Steps 1003 through 1015 from the building 101 into a first profile of the building 101. Next, in Step 1021, the data acquisition unit 110 can perform a data compression on the first profile as needed so that this profile can be forwarded to the gateway 116 in an efficient manner. Various data compression algorithms known to one of ordinary skill in the art can be employed in this Step 1021. Further, one of ordinary skill in the art recognizes that this data compression Step 1021 may be optional if the first profile is not too memory intensive.

Next, in Step 1024, this first profile is transmitted over the communications network 118 to the efficiency calculation system 120. This Step 1024 can include the handoff or transmission of data from the data acquisition unit 110 to the gateway 116. This Step 1024 also addresses any data transformations of the first profile which may need to be performed by the gateway 116 so that the first profile is formatted so that they can be sent over the computer communications network 118 which can comprise the internet.

As noted previously, the data acquisition unit 110 can be coupled to an enhanced environmental sensor 104B which communicates with the other environmental sensors 104 using the Zigbee standard wireless communications protocol. The data acquisition unit 110 can also use the Zigbee wireless communications protocol to communicate with the gateway 116. The gateway 116 can transform the first profile into a format that is suitable to transmission over the computer communications network 118 which can comprise the Internet. In other words, the gateway 116 can receive the first profile from the data acquisition unit 110 according to the Zigbee wireless communication protocol. Next, the gateway 116 can then format the profile as needed for transmission over the internet using TCP/IP protocol which is the standard as of this writing.

Next, in step 1027, this first profile is received by the efficiency calculation system 120 from the communications network 118. Subsequently, in step 1030, the efficiency calculation system 120 can store the first profile in the homeowner historical database 122A.

Next, in routine or submethod 1033, the efficiency calculation system 120 can calculate the efficiency metrics based on the first profile which was received. These efficiency metrics which are generated by the efficiency calculation system 120 can include, but are not limited to, an EER value which is a co-efficient of performance value for an air conditioning system, an R-value calculation relating to the insulation of the building 101, an HVAC equipment efficiency metric, a heat loss calculation metric, an energy consumption metric, and a utility and electrics metric. Further details of these calculations will be described below in connection with FIG. 11.

Next, after routine 1033, the efficiency calculation system 120 can identify one or more zones 120 within the building 101 which may have potential energy efficiency issues. In step 1036, the efficiency calculation system 120 can identify those problem or trouble zones 102 by comparing the efficiency metrics calculated in routine or submethod 1033. Next, in step 1039, the efficiency calculation system 120 can create a second profile containing the efficiency metrics calculated in routine 1033 in addition to the identity of zones 102 within the building 101 which may have potential energy efficiency issues.

Next, in step 1042, the efficiency calculation system 120 can send the second profile over the computer communications network 118 to the energy client which may be running or executed by the enhanced environmental sensor 104B or the personal computer 106 (or any combination thereof). Step 1042 can include the communications between the efficiency calculation system 120 and the computer communications network 118 as well as the communications between the computer communications network 118 and the gateway 116. Step 1042 can further include the communications between the gateway 116 and the data acquisition unit 110.

In Step 1045, the energy metrics client 720 which can be executed by the enhanced thermostat 109 or the personal computer 106 can receive the second profile that was generated by the efficiency calculation system 120. According to this second profile, the energy metrics client 720 can display visuals associated with the second profile to the user with either the display 108 or the monitor 847 of the personal computer 106. These various visuals can include, but are not limited to, the user interfaces illustrated in FIG. 2 through FIG. 6 described above.

Next, in step 1051, the energy metrics client 720 can display the one or more zones 102 with potential energy efficiency problems. Specifically, the energy metrics client 720 (not illustrated in FIG. 1A but see FIG. 7) may display a user interface 400 illustrated in FIG. 4. Specifically, the energy metrics client 720 can display the zones needing improvement field 412 as illustrated in the user interface 400 of FIG. 4. Next, the energy metrics client 720 may receive a selection of the one or more zones that were identified with potential energy efficiency problems in the zones needing improvement field 412 of the user interface 400 of FIG. 4.

Next, in step 1057, the energy metrics client 720 can send a request to the energy efficiency calculation system 120 for additional information regarding the zones of interests that were selected by the occupant of the building 101 which may need further improvement with respect to energy efficiency.

Figure 10B:
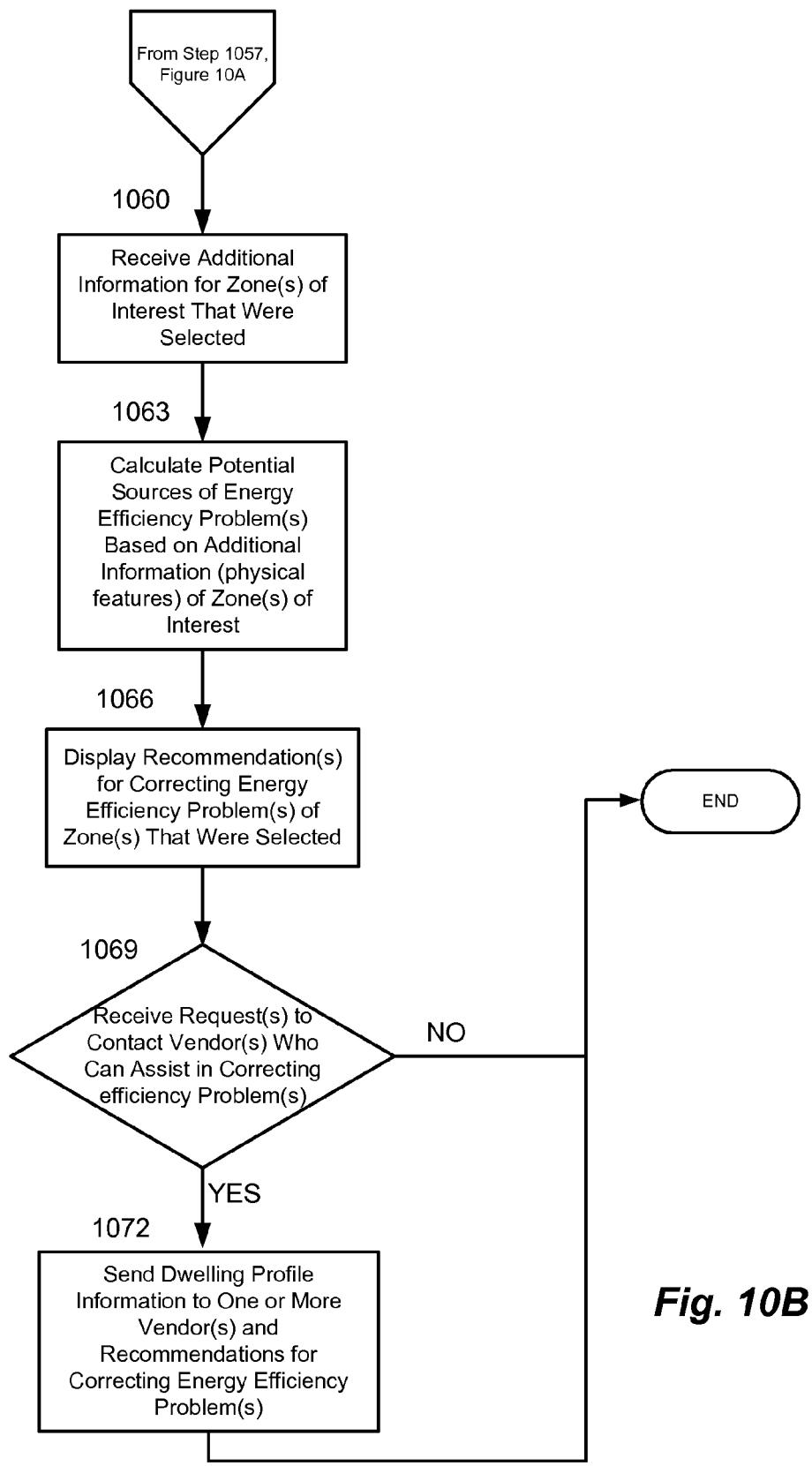
FIG. 10B is a continuation of the logic flow diagram of FIG. 10A illustrating an exemplary method for calculating energy efficiency metrics of a building and one or more zones within a building according to one exemplary embodiment of the invention.

Referring now to FIG. 10B, this figure is a continuation of the logic flow diagram of FIG. 10A illustrating an exemplary method 1000 of calculating energy efficiency metrics of a building 101 and one or more zones within the building 101 according to one exemplary embodiment of the invention. After Step 1057 in FIG. 10A, the method continues to the first Step 1060 in FIG. 10B. In Step 1060, the efficiency metrics client 720 residing on either the thermostat 109 or the personal computer 106 can receive the additional information for a zone 102 of interest that may have been selected in connection with the user interface 500 as illustrated in FIG. 5. Step 1060 can include the efficiency metrics client 720 forwarding on the collected data about a particular zone 102 to the efficiency calculation system 120 over the computer communications network 118.

In Step 1063, the efficiency calculation system 120, which receives the additional data for anyone of additional zones 102 of interest, can calculate the potential sources of energy efficiency problems based on the additional information, such as physical features of these zones 102, that may be provided by an occupant of the building 101 with the efficiency metrics client 720. The efficiency calculation system 120 can supply the additional information about the zones 102 into various equations such as those described above in connection routine 1033 and those associated with the program modules of FIG. 9. If the heat loss for a zone is particularly high, the software displays recommendations to the user based on the information previously submitted by the user (e.g. type of windows)

In Step 1066, the efficiency calculation system 120 can align the answers from its equations with a predefined set of potential solutions to the issue of why a particular zone may be less energy efficient relative to other zones 102 within a building 101. Step 1066 can include the efficiency calculation system forwarding on these recommendations over the communications network 118 to the efficiency metrics client 720 which is executed by the enhanced thermostat 109 or the personal computer 106. Step 1066 can further include the display of recommendations for correcting the energy efficiency problems of these zones 102 which were selected by the user. This display of recommendations can generally correspond with the user interface 600 as illustrated and discussed above in connection with FIG. 6. For example, the recommendations can include recommendations for replacing certain windows 103 for a particular zone 102 of a building 101.

In decision Step 1069, the efficiency metrics client 720 can determine if a user has selected an option for the system 100 to contact a particular vendor based on the recommendations illustrated in the user interface 600 of FIG. 6. If the inquiry to decision Step 1069 is negative, then the "no" branch is followed to the end of the process. If the inquiry to decision Step 1069 is positive, then the "yes" branch is followed to Step 1072.

In Step 1072, the efficiency metrics client 720 can send a request to the efficiency calculation system 120 over the communications network so that the efficiency calculation system 120 can contact an appropriate home efficiency product vendor through the home efficiency product back end system 124. After Step 1072, the process then ends.

Figure 11:
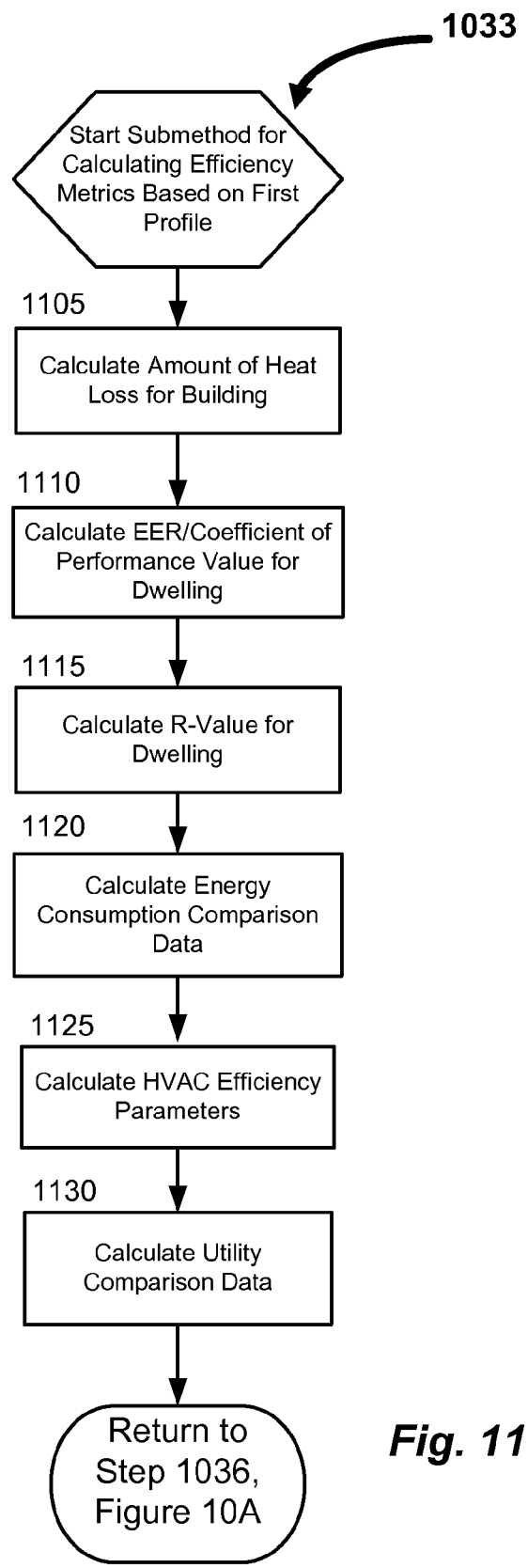
FIG. 11 is a submethod or routine of the method of FIG. 10 for calculating energy efficiency metrics of a building according to one exemplary embodiment of the invention.

Referring now to FIG. 11, this Figure is sub-method or routine 1033 of the method 1000 of FIG. 10 for calculating energy efficiency metrics of a building 101 according to one exemplary embodiment of the invention. Step 1105 is the first step in the routine 1033.

In Step 1105, the efficiency calculation system 120 can calculate an R-value for the building 101. The R-Value is computed by multiplying the surface area of the zone or building being computed, by the temperature change observed for the period, divided by the computed heat loss rate.

In Step 1110, the efficiency calculation system 120 can calculate an EER value or coefficient of performance value for the air conditioning system of the building 101. The EER is computed by dividing the heating/cooling power of the system by the amount of energy (W) required to achieve that cooling power.

Next, in Step 1115, the efficiency calculation system 120 can calculate an R-value for the building 101. The R-Value is computed by multiplying the surface area of the zone or building being computed, by the temperature change observed for the period, divided by the computed heat loss rate.

Next, in Step 1115, the efficiency calculation system 120 can calculate an amount of heat loss for the building 101 based on the first profile sent to the efficiency calculation system 120 from the efficiency metrics client 720 across the computer communications network 118. For the portions of the profile where the heating/cooling system is inactive, the observed change in temperature can be multiplied by the number of cubic feet and the theoretical number of BTUs per cubic foot, per degree F. (this is approximately 0.0182 BTU/ ($ft^3$F)), to yield the number of BTUs lost over the period. This is the estimate heat loss.

Next, in Step 1120, the efficiency calculation system 120 can calculate energy consumption comparison data based on home owner historical data 122A and comparison data sorted by geography 122B. The efficiency calculation system 120 can generate certain graphs such as those illustrated in FIGS. 2 and 3 described above.

Subsequently, in Step 1125, the efficiency calculations system 120 can determine HVAC efficiency parameters based on data that is taken from each HVAC unit 112 itself or data supplied by the AMI backend system 126.

And in Step 1130, the efficiency calculation system 120 can calculate utility comparison data. Utility comparison data provides statistical comparisons of dwelling population segments when observed by the utility provider. For the end-user, statistical comparisons can be generate between their dwelling and closest comparables in terms of dwelling type and location. Statistical comparisons can be comparisons of averages, standard deviations, graphical distribution curves, etc. After Step 1130, the process returns to Step 1036 of FIG. 10A.

Alternative embodiments of the method and system 100 will become apparent to one of ordinary skill in the art to which the invention pertains without departing from its spirit and scope. Thus, although this invention has been described in exemplary form with a certain degree of particularity, it should be understood that the present disclosure is made only by way of example and that numerous changes in the details of construction and the combination and arrangement of parts or steps may be resorted to without departing from the scope or spirit of the invention. Accordingly, the scope of the present invention may be defined by the appended claims rather than the foregoing description.

What is claimed is:

1. A system for calculating energy metrics of a building comprising:
   a first environmental sensor for measuring at least one of a temperature and a relative humidity of a first zone contained within the building;
   a second environmental sensor for measuring at least one of a temperature and a relative humidity of a second zone contained within the building;
   a thermostat in communication with the first and second environmental sensors, for passing data from the environmental sensors to a data acquisition unit;
   the data acquisition unit storing and formatting the data received from the environmental sensors into a profile; and
   an efficiency calculation system for receiving the profile from the gateway and determining one or more energy metrics for the first and second zones within the building, the efficiency calculation system providing energy metrics from other similar buildings in a geography containing both the building and other similar buildings.

2. The system of claim 1, further comprising a third environmental sensor for measuring at least one of a temperature and a relative humidity which is external relative to the building.

3. The system of claim 1, wherein the thermostat comprises a display for presenting data.

4. The system of claim 1, further comprising a gateway in communication with data acquisition unit, for receiving and converting the profile from a first communications protocol to a second communications protocol.

5. The system of claim 1, wherein the efficiency calculation system generates a recommendation on how to improve an efficiency metric of the building.

6. The system of claim 3, wherein the efficiency calculation system generates a user interface which is presented on the display of the thermostat.

7. The system of claim 3, wherein the efficiency calculation system generates a user interface which is presented on the display of the thermostat, the user interface also presenting the recommendation on how to improve an efficiency metric of the building.

8. The system of claim 1, wherein the efficiency calculation system receives data from one or more HVAC devices coupled to the building.

9. The system of claim 1, wherein the efficiency calculation system receives data from one or more utility meters coupled to the building.

10. The system of claim 9, wherein the utility meters are managed by an advanced metering infrastructure.

11. A method for calculating energy metrics of a building comprising:
    measuring at least one of a temperature and a relative humidity of a zone contained within the building;
    measuring at least one of a temperature and a relative humidity which is external relative to the building;
    formatting data received from the environmental sensors into a profile;
    determining one or more energy metrics for the building based on the profile;
    providing energy metrics from other similar buildings in a geography containing both the building and other similar buildings; and
    identifying a particular zone within the building which may have energy efficiency issues.

12. The method of claim 11, further comprising converting the profile from a first communications protocol to a second communications protocol.

13. The method of claim 11, further comprising providing one or more recommendations for increasing energy efficiency for the particular zone within the building.

14. The method of claim 11, further comprising generating a user interface which is presented on a display of a thermostat.

15. The method of claim 14, further comprising displaying the one or more recommendations with the user interface.

16. A computer-implemented system for calculating energy metrics of a building comprising:
    means for measuring at least one of a temperature and a relative humidity of a zone contained within the building;
    means for measuring at least one of a temperature and a relative humidity which is external relative to the building;
    means for formatting data received from the environmental sensors into a profile;
    means for determining one or more energy metrics for the building based on the profile;
    means for providing energy metrics from other similar buildings in a geography containing both the building and other similar buildings; and
    means for identifying a particular zone within the building which may have energy efficiency issues.

17. The system of claim 16, further comprising means for converting the profile from a first communications protocol to a second communications protocol.

18. The system of claim 16, further comprising means for providing one or more recommendations for increasing energy efficiency for the particular zone within the building.

19. The system of claim 16, further comprising means for generating a user interface which is presented on a display of a thermostat.

20. The system of claim 16, further comprising displaying the one or more recommendations with the user interface.

* * * * *